US012217956B2

(12) United States Patent
Watanabe et al.

(10) Patent No.: US 12,217,956 B2
(45) Date of Patent: Feb. 4, 2025

(54) CARBON FILM DEPOSITION METHOD AND DEPOSITION APPARATUS

(71) Applicant: Tokyo Electron Limited, Tokyo (JP)

(72) Inventors: Yosuke Watanabe, Yamanashi (JP); Shota Chida, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 402 days.

(21) Appl. No.: 17/647,996

(22) Filed: Jan. 14, 2022

(65) Prior Publication Data

US 2022/0246429 A1 Aug. 4, 2022

(30) Foreign Application Priority Data

Feb. 4, 2021 (JP) .................................. 2021-016802

(51) Int. Cl.
*H01L 21/02* (2006.01)
*C23C 16/26* (2006.01)
*C23C 16/56* (2006.01)

(52) U.S. Cl.
CPC ........ *H01L 21/02337* (2013.01); *C23C 16/26* (2013.01); *C23C 16/56* (2013.01); *H01L 21/02115* (2013.01); *H01L 21/0228* (2013.01)

(58) Field of Classification Search
CPC ................................................ H01L 21/02337
See application file for complete search history.

(56) References Cited

U.S. PATENT DOCUMENTS

| 5,198,263 | A | * | 3/1993 | Stafford | ................. | C03C 17/22 427/577 |
| 6,035,803 | A | * | 3/2000 | Robles | .............. | H01J 37/32449 257/E21.264 |
| 6,821,889 | B2 | * | 11/2004 | Elers | ....................... | C23C 16/44 257/E21.585 |
| 8,795,434 | B2 | * | 8/2014 | Lin | ........................ | C01B 32/16 118/724 |
| 2003/0091938 | A1 | * | 5/2003 | Fairbairn | .......... | H01L 21/76829 430/329 |
| 2003/0121887 | A1 | * | 7/2003 | Garvey | ................. | C01B 32/162 216/65 |
| 2008/0003838 | A1 | * | 1/2008 | Haukka | ............. | C23C 16/45546 257/E21.24 |
| 2022/0235457 | A1 | * | 7/2022 | Chida | ................. | C23C 16/0272 |
| 2022/0246429 | A1 | * | 8/2022 | Watanabe | ......... | H01L 21/02304 |
| 2023/0245882 | A1 | * | 8/2023 | Watanabe | ........... | C23C 16/0272 438/758 |

FOREIGN PATENT DOCUMENTS

| JP | 2014-033186 | 2/2014 |
| JP | 2016-025262 | 2/2016 |
| JP | 2016-153518 | 8/2016 |
| JP | 2017-210640 | 11/2017 |

\* cited by examiner

Primary Examiner — William A Harriston
(74) Attorney, Agent, or Firm — IPUSA, PLLC

(57) ABSTRACT

A carbon film deposition method includes supplying a carbon-containing gas and a halogen gas to a substrate to deposit a carbon film on the substrate by using chemical vapor deposition, and supplying a gas that reacts with halogens constituting the halogen gas to reduce the halogens contained in the carbon film. A cycle including the supplying of the carbon-containing gas and the halogen gas and the supplying of the gas that reacts with the halogens is repeated a plurality of times.

12 Claims, 14 Drawing Sheets

| EXAMPLE NO. | CARBON FILM DEPOSITION TIME | NH₃ ANNEALING TIME | NUMBER OF CYCLES | |
|---|---|---|---|---|
| COMPARATIVE EXAMPLE | 80 min | – | – | |
| EXAMPLE 1 | 10 min | 5 min | 2 cyc | DEPENDENCY ON NUMBER OF CYCLES |
| EXAMPLE 2 | 10 min | 5 min | 5 cyc | |
| EXAMPLE 3 | 10 min | 5 min | 8 cyc | |
| EXAMPLE 4 | 5 min | 5 min | 10 cyc | TOTAL DEPOSITION TIME IS FIXED |
| EXAMPLE 5 | 2.5 min | 5 min | 20 cyc | |

FIG.14

| EXAMPLE NO. | CARBON FILM DEPOSITION TIME | NH₃ ANNEALING TIME | NUMBER OF CYCLES | DEPOSITION RATE | IN-PLANE UNIFORMITY |
|---|---|---|---|---|---|
| COMPARATIVE EXAMPLE | 80 min | – | – | 0.38 nm/min | 4.6 |
| EXAMPLE 2 | 10 min | 5 min | 5 cyc | 0.56 nm/min | 4.3 |
| EXAMPLE 4 | 5 min | 5 min | 10 cyc | 0.74 nm/min | 2.8 |
| EXAMPLE 5 | 2.5 min | 5 min | 20 cyc | 0.90 nm/min | 1.6 |

CARBON FILM DEPOSITION METHOD AND DEPOSITION APPARATUS

CROSS-REFERENCE TO RELATED APPLICATIONS

This patent application is based on and claims priority to Japanese Patent Application No. 2021-016802 filed on Feb. 4, 2021, the entire contents of which are incorporated herein by reference.

TECHNICAL FIELD

The present disclosure relates to a carbon film deposition method and a carbon film deposition apparatus.

BACKGROUND

Conventionally, a carbon film deposition method and deposition apparatus that deposit a carbon film on a substrate are known (see, for example, Patent Document 1). In such a carbon film deposition method, a hydrocarbon-based carbon source gas and a pyrolysis temperature lowering gas containing halogen elements are introduced into a processing chamber, and a carbon film is deposited by using a non-plasma thermal CVD method.

RELATED ART DOCUMENT

Patent Document

[Patent Document 1] Japanese Laid-open Patent Application Publication No. 2014-33186

SUMMARY

According to one aspect of the present disclosure, a carbon film deposition method includes supplying a carbon-containing gas and a halogen gas to a substrate to deposit a carbon film on the substrate by using chemical vapor deposition, and supplying a gas that reacts with halogens constituting the halogen gas to reduce the halogens contained in the carbon film. A cycle is repeated a plurality of times. The cycle includes the supplying of the carbon-containing gas and the halogen gas and the supplying of the gas that reacts with the halogens.

BRIEF DESCRIPTION OF THE DRAWINGS

FIG. 14 is a table indicating the results of the examples as a whole.

DETAILED DESCRIPTION OF EMBODIMENTS

In the following, an embodiment of the present invention will be described with reference to the drawings.

[Deposition Apparatus]

Figure 1:
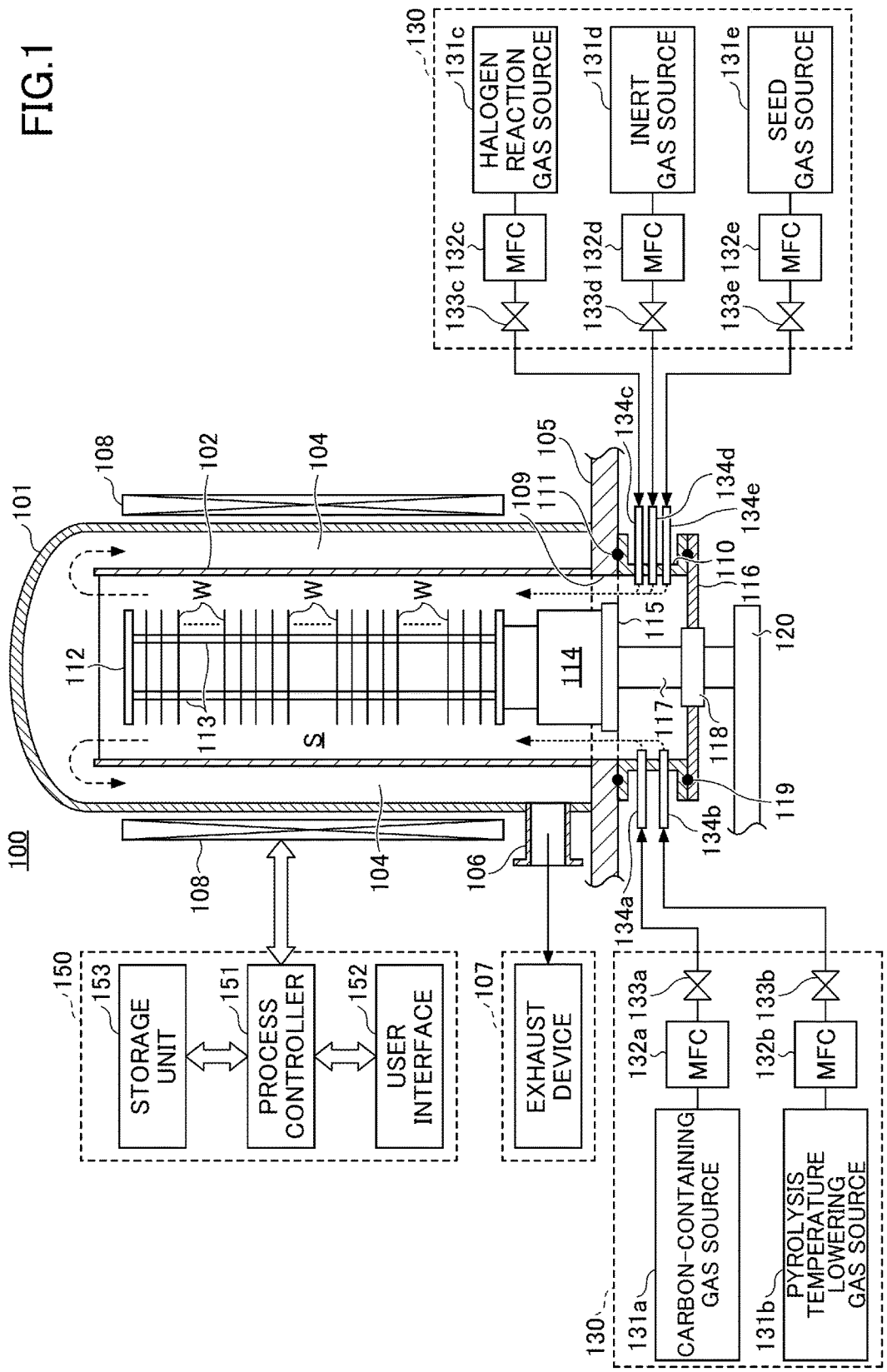
FIG. 1 is a cross-sectional view schematically illustrating an example of a deposition apparatus configured to perform a deposition method of the present disclosure.

FIG. 1 is a cross-sectional view schematically illustrating an example of a deposition apparatus according to an embodiment of the present disclosure.

As illustrated in FIG. 1, a deposition apparatus 100 is configured as a vertical batch-type deposition apparatus and includes a cylindrical outer wall 101 having a ceiling and a cylindrical inner wall 102 provided inside of the outer wall 101. The outer wall 101 and the inner wall 102 are, for example, formed of quartz, and an inner region of the inner wall 102 is a processing chamber S in which multiple semiconductor wafers W (hereinafter, simply referred to as wafers), which are objects to be processed, are processed in one batch.

The outer wall 101 and the inner wall 102 are separated from each other along a horizontal direction by having an annular space 104 and bonded to a base material 105 at respective lower ends. An upper end of the inner wall 102 is separated from the ceiling of the outer wall 101 such that an upper portion of the processing chamber S communicates with the annular space 104. The annular space 104 communicating to the upper portion the processing chamber S serves as an exhaust path. The gas supplied and diffused to the processing chamber S flows from a lower portion of the processing chamber S to the upper portion of the processing chamber S and is sucked into the annular space 104. An exhaust pipe 106 is connected to, for example, a lower end of the annular space 104, and the exhaust pipe 106 is connected to an exhaust device 107. The exhaust device 107 includes a vacuum pump or the like to exhaust the inside of the processing chamber S and adjust the internal pressure of the processing chamber S to a pressure appropriate for processing.

Outside the outer wall 101, a heating device 108 is provided to surround the processing chamber S. The heating device 108 adjusts the temperature inside the processing chamber S to a temperature appropriate for processing and heats multiple wafers W as a whole.

The lower portion of the processing chamber S communicates with an opening 109 provided in the base material 105. The opening 109 is connected to, for example, a manifold 110 cylindrically formed of stainless steel through a seal member 111, such as an O-ring. The lower end of the manifold 110 forms an opening, and a wafer boat 112 is inserted into the processing chamber S through the opening. The wafer boat 112 is formed of, for example, quartz, and includes multiple pillars 113. In the pillars 113, grooves (not illustrated) are formed, and the grooves support multiple substrates to be processed at one time. This allows multiple wafers W, e.g., 50-150 wafers W to be mounted in the wafer boat 112 in multiple stages, as the substrates to be processed. The wafer boat 112 in which multiple wafers W are mounted is inserted into the processing chamber S, so that multiple wafers W are accommodated inside the processing chamber S.

The wafer boat 112 is mounted on a table 115 through a heat insulating tube 114 formed of quartz. The table 115 is, for example, supported on a rotating shaft 117 passing through a lid 116 formed of stainless steel. The lid 116 opens and closes the opening at the lower end of the manifold 110. At the through-portion of the lid 116, for example, a magnetic fluid seal 118 is provided such that the rotating shaft 117 is rotatably supported while the rotating shaft 117 is airtightly sealed. Additionally, between the periphery of the lid 116 and the lower end of the manifold 110, a seal member 119 formed of an O-ring, for example, is interposed to maintain the seal efficiency of the inside of the processing chamber S. The rotating shaft 117 is attached to, for example, a distal end of an arm 120 that is supported by a lifting mechanism (which is not illustrated) such as a boat elevator. This causes the wafer boat 112, the lid 116, and the like to integrally move up and down in a vertical direction to be inserted into the processing chamber S and removed from the processing chamber S.

The deposition apparatus 100 includes a process gas supply mechanism 130 that supplies gasses used for processing to the inside of the processing chamber S.

The process gas supply mechanism 130 in the present embodiment includes a carbon-containing gas source 131a, a pyrolysis temperature lowering gas source 131b, a halogen reaction gas source 131c, an inert gas source 131d, and a seed gas source 131e.

The carbon-containing gas source 131a is connected to a gas supply port 134a via through a mass flow controller (MFC) 132a and an open/close valve 133a. Similarly, the pyrolysis temperature lowering gas source 131b is connected to a gas supply port 134b through a mass flow controller (MFC) 132b and an open/close valve 133b, the halogen reaction gas source 131c is connected to a gas supply port 134c through a mass flow controller (MFC) 132c and an open/close valve 133c, the inert gas source 131d is connected to a gas supply port 134d through a mass flow controller (MFC) 132d and an open/close valve 133d, and the seed gas source 131e is connected to a gas supply port 134e through a mass flow controller (MFC) 132e and an open/close valve 133e. Each of the gas supply ports 134a to 134e is provided to penetrate the side wall of the manifold 110 in a horizontal direction, to diffuse the supplied gas into the processing chamber S above the manifold 110.

The carbon-containing gas supplied from the carbon-containing gas source 131a is a gas for depositing a carbon film by low pressure CVD; various gases can be used as long as carbon is contained, and a hydrocarbon-based carbon source gas may be used, for example.

Examples of the hydrocarbon-based carbon source gas may include gases containing hydrocarbon represented by at least one molecular formula of the following (where n is a natural number greater than or equal to 1 and m is a natural number greater than or equal to 2).

$C_nH_{2n+2}$
$C_mH_{2m}$
$C_mH_{2m-2}$

An example of the hydrocarbon-based carbon source gas may include benzene gas ($C_6H_6$).

Examples of a hydrocarbon represented by the molecular formula $C_nH_{2n+2}$ may include the following.
methane gas ($CH_4$)
ethane gas ($C_2H_6$)
propane gas ($C_3H_8$)
butane gas ($C_4H_{10}$, including other isomers)
pentane gas ($C_5H_{12}$, including other isomers)

Examples of a hydrocarbon represented by the molecular formula $C_mH_{2m}$ may include the following.
ethylene gas ($C_2H_4$)
propylene gas ($C_3H_6$, including other isomers)
butylene gas ($C_4H_8$, including other isomers)
pentene gas ($C_5H_{10}$, including other isomers)

Examples of a hydrocarbon represented by the molecular formula $C_mH_{2m-2}$ may include the following.
acetylene gas ($C_2H_2$)
propyne gas ($C_3H_4$, including other isomers)
butadiene gas ($C_4H_6$, including other isomers)
isoprene gas ($C_5H_8$, including other isomers)

As the pyrolysis temperature lowering gas supplied from the pyrolysis temperature lowering gas source 131b, a gas containing a halogen element is used. The gas containing the halogen element has a catalytic function that lowers the pyrolysis temperature of the hydrocarbon-based carbon source gas to lower the deposition temperature of the carbon film by thermal CVD.

The halogen elements include fluorine (F), chlorine (Cl), bromine (Br), and iodine (I). The gas containing the halogen element may be a single halogen element, i.e., a single fluorine ($F_2$) gas, a single chlorine ($Cl_2$) gas, a single bromine ($Br_2$) gas, and a single iodine ($I_2$) gas, or a compound containing these. The halogen element alone does not require heat for pyrolysis and has the advantage of effectively lowering the pyrolysis temperature of the hydrocarbon-based carbon source gas. Among the above-described halogen elements, fluorine is highly reactive and may impair the surface roughness and flatness of the carbon film that is deposited. Therefore, as the halogen elements, chlorine, bromine, and iodine, except fluorine, are preferred. Among these, chlorine is preferable from the viewpoint of handling.

The gas supplied from the halogen reaction gas source 131c is an element that reacts with halogen and includes $NH_3$, $H_2$, $N_2$, and the like. That is, these gases have a property of reacting with halogen to vaporize, and react with halogen on the surface of the carbon film or in the film, and can remove halogen on the surface of the carbon film or in the carbon film. Among these, $NH_3$ is the most reactive gas with halogen in the low temperature CVD process, and it is preferable to use $NH_3$ as the halogen reaction gas. However, the halogen reaction gas is not limited to ammonia, for example, $H_2$ and/or $N_2$ may be used for a higher temperature process.

The inert gas supplied from the inert gas source 131d is used as a purge gas or a dilution gas. As the inert gas, for example, $N_2$ gas or a noble gas such as Ar gas may be used.

The seed gas supplied from the seed gas source 131e is for forming a seed layer on a base to improve the adhesion between the base and the carbon film, prior to the deposition of the carbon film. As the seed layer, a boron-based thin film is used. As the boron-based thin film, boron or stoichiometric composition or boron rich boron nitride is preferred.

As the seed gas, a boron-containing gas is used. As the boron-containing gas used as the seed gas, a borane-based gas, which is represented by a diborane ($B_2H_6$) gas, or a boron-trichloride ($BCl_3$) gas may be used. Among these, $B_2H_6$ gas is preferred. When the boron-based thin film is boron nitride, a nitride gas is used in addition to the boron-containing gas. As the nitride gas, ammonia ($NH_3$) gas may be preferably used. Additionally, as the nitride gas, an organic amine gas or a hydrazine gas may also be used. When the nitride gas is used, a nitride gas supply source is separately provided to supply the nitride gas from a separate supply port through a separate mass flow controller (MFC) and a separate open/close valve into the processing chamber S, preferably.

The deposition apparatus 100 includes a controller 150. The controller 150 includes a process controller 151 formed of, for example, a microprocessor (a computer), and control of each component of the deposition apparatus 100 is performed by the process controller 151. A user interface 152 and a storage unit 153 are connected to the process controller 151.

The user interface 152 includes an input unit including a touch panel display or a keyboard for performing a command input operation and the like for the operator to manage the deposition apparatus 100, and a display unit including a display that visualizes and displays an operation status of the deposition apparatus 100.

The storage unit 153 stores what is called a process recipe including a control program that implements various processes performed by the deposition apparatus 100 under the control of the process controller 151 and a program for causing each component of the deposition apparatus 100 to perform a process in accordance with a processing condition. The process recipe is stored in a storage medium in the storage unit 153. The storage medium may be a hard disk, a semiconductor memory, or a portable medium, such as a CD-ROM, a DVD, a flash memory, or the like. Additionally, the process recipe may be appropriately transmitted from another device, for example, through a dedicated line.

The process recipe is read from the storage unit 153 in response to an operator's instruction or the like from the user interface 152 as necessary, and the process controller 151 causes the deposition apparatus 100 to perform processing according to the process recipe that is read.

<Carbon Film Deposition Method>

Next, a carbon film deposition method according to the embodiment of the present disclosure that is performed by the deposition apparatus of FIG. 1 will be described.

Figure 2:
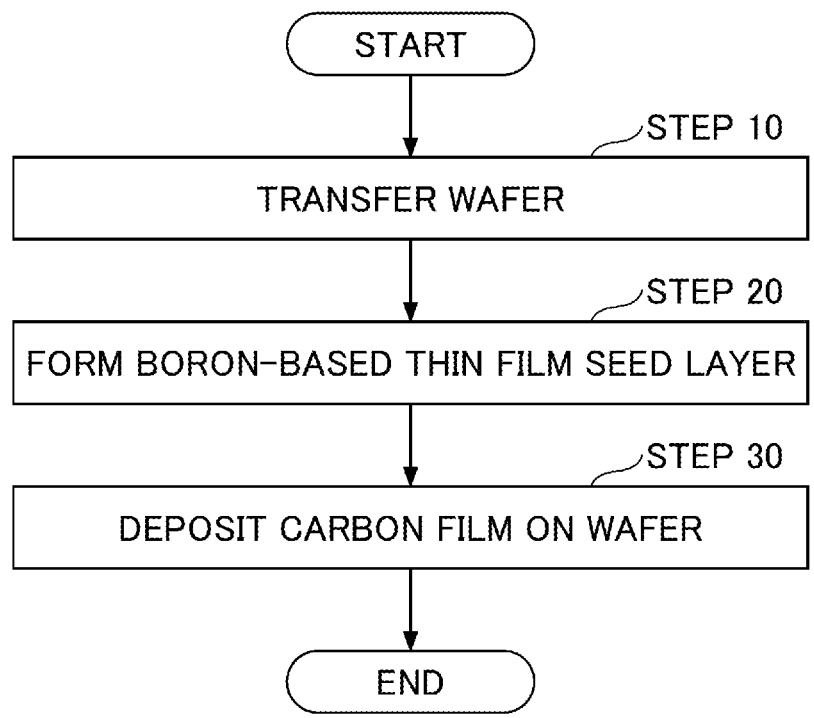
FIG. 2 is a flowchart illustrating a flow diagram of a carbon film deposition method according to an embodiment of the present disclosure.
Figure 3A:
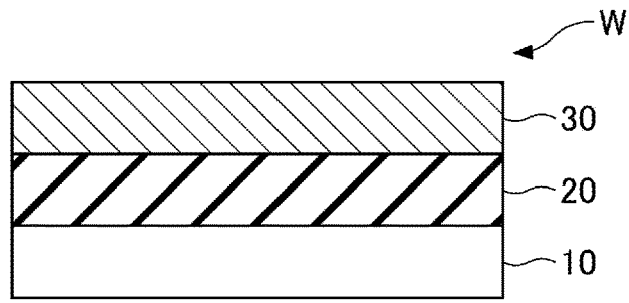
FIG. 3A, FIG. 3B, and FIG. 3C are cross-sectional views in a process of performing the carbon film deposition method according to the embodiment of the present disclosure.
Figure 3B:
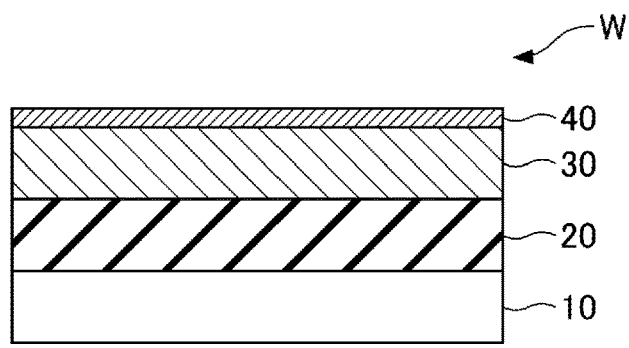
Figure 3C:
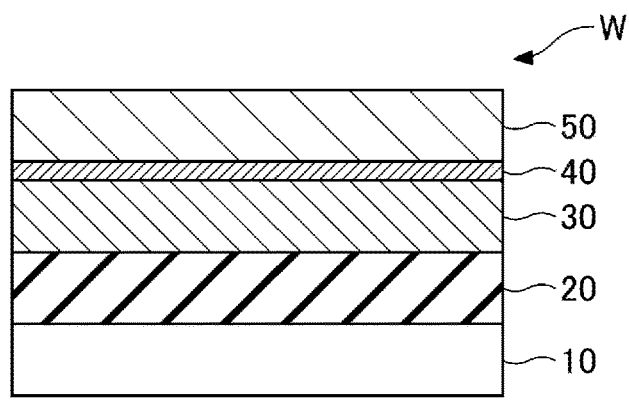

FIG. 2 is a flowchart illustrating a flow of a carbon film deposition method according to the embodiment of the present disclosure, and FIG. 3A, FIG. 3B, and FIG. 3C are cross-sectional views in a process thereof.

First, for example, as illustrated in FIG. 3A, multiple wafers W, for example, 50 to 150 wafers W, in each of which a silicon oxide film 20 is formed on a silicon substrate 10 having a predetermined structure (which is not illustrated) formed on the top of the silicon substrate 10, and an amorphous silicon film 30 is formed thereon, are mounted on the wafer boat 112, and the wafer boat 112 is inserted into the processing chamber S in the deposition apparatus 100 from a lower side, to transfer the multiple wafers W into the processing chamber S (step 10). Then, by closing the lower end opening of the manifold 110 with the lid 116, an enclosed space is made inside the processing chamber S. The processing chamber S is vacuumed in this state to maintain a predetermined reduced-pressure atmosphere, the power supplied to the heating device 108 is controlled to increase the temperature of the wafer to maintain the process temperature, and the wafer boat 112 is rotated.

In this state, first, the seed gas source 131e initially supplies a gas containing the boron-containing gas as the seed gas to be adsorbed on the wafer surface (the surface of the amorphous silicon film 30 that is a base) to form a seed layer 4 to improve adhesion (step 20, FIG. 3B).

In step 2, as the boron-containing gas supplied from the seed gas source 131e, a borane-based gas represented as a diborane ($B_2H_6$) gas or a boron-trichloride ($BCl_3$) gas is used to form the boron-based thin film as the seed layer 40.

As the boron-based thin film, a boron film formed of boron alone or a stoichiometric composition or boron-rich boron nitride film may be preferably used. In the case of the boron film, as the gas containing the boron-containing gas, the boron-containing gas alone can be used to deposit the film by pyrolysis. In the case of the boron nitride film, as the gas containing the boron-containing gas, in addition to the above-described boron-containing gas, a nitride gas, such as an ammonia ($NH_3$) gas, an organic amine gas, a hydrazine gas, or the like, is used. For the boron-containing gas, the $B_2H_6$ gas is preferred, and for the nitride gas, the $NH_3$ gas is preferred.

The temperature of the wafer W when the seed layer 40 is formed in step 20 is preferably 200° C. to 300° C. in view of the capability of film formation and good controllability.

After forming the seed layer 40 in step 20, the inside of the processing chamber S is purged and a deposition process of a carbon film 50 is performed by using thermal CVD without using plasma assist (step 30 and FIG. 3C).

In the carbon film deposition process of the thermal CVD in step 30, the carbon-containing gas source 131a supplies the hydrocarbon-based carbon source gas containing hydrocarbon, for example, the $C_4H_6$ gas, to the processing chamber S as the carbon-containing gas, and the pyrolysis temperature lowering gas source 131b supplies the halogen-containing gas, for example, the $Cl_2$ gas, as the pyrolysis temperature lowering gas. Then, the hydrocarbon-based carbon source gas is heated at a predetermined temperature lower than the pyrolysis temperature to cause pyrolysis, so that the carbon film 50 is deposited on the surface of the wafer W by thermal CVD.

As described above, when the carbon film is formed, by using the pyrolysis temperature lowering gas, the pyrolysis temperature of the hydrocarbon-based carbon source gas is lowered by the catalytic effect, and the carbon film is deposited at a temperature lower than the pyrolysis temperature of the carbon source gas. That is, the temperature required for the deposition of the carbon film in the thermal CVD process using the hydrocarbon-based carbon source gas, which is 650° C. or higher, can be lowered and the deposition can be achieved at a low temperature such as about 300° C.

Additionally, by using the $Cl_2$ gas as the gas containing halogen elements constituting the pyrolysis temperature lowering gas, hydrogen (H) can be extracted from the hydrocarbon-based carbon source gas ($C_xH_y$), for example, ethylene gas ($C_2H_4$), so that the ethylene gas can be decomposed. That is, when the carbon film is deposited, the halogen element such as chlorine (Cl) pulls H on a surface layer and is evacuated, for example, as HCl. Thus, H is separated to form a dangling bond, and the dangling bond contributes to the deposition. Additionally, by using a layer, on which an aminosilane-based gas is adsorbed, as the seed layer between the base and the carbon film, the adhesion between the base and the carbon film is improved.

However, when a silicon film is used as the base, even when the aminosilane-based gas is adsorbed in the seed layer, the adhesion is reduced to the degree that even a thin carbon film having a film thickness of about 10 nm is peeled when the film temperature of the film is about 350° C. or higher.

Figure 4A:
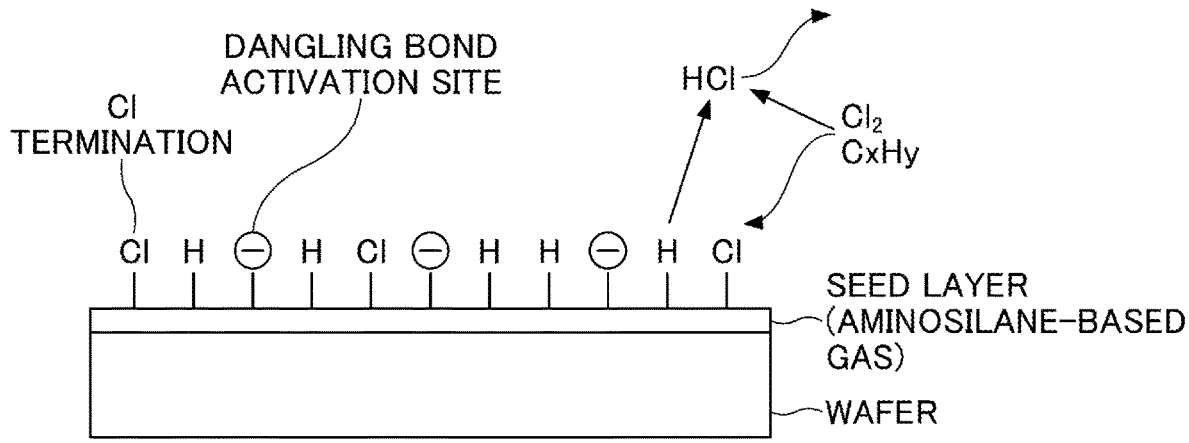
FIG. 4A and FIG. 4B are diagrams illustrating a comparison between a reaction model in which an aminosilane-based seed layer is used as a seed layer and a reaction model in which a boron-based thin film is used as the seed layer.

That is, when the $Cl_2$ gas is used as the pyrolysis temperature lowering gas, because Cl is highly reactive, even if an aminosilane-based seed layer is present, Cl tends to terminate the dangling bond, as illustrated in FIG. 4A, depending on a material of the base. This reduces the number of the dangling bond activation sites, which are carbon adsorption sites, to cause inhibition of C adsorption. Therefore, even in a thin film thickness of about 10 nm, reduction of adhesion is caused.

Figure 4B:
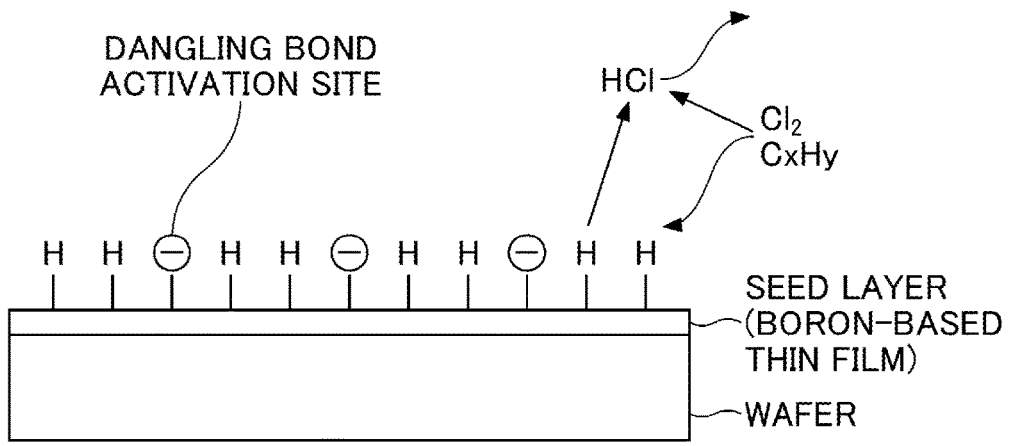

With respect to the above, in the present embodiment, because a boron-based thin film is used as the seed layer 40, the adhesion is not easily reduced due to the difference in reactivity with the silicon film that is the base. That is, by using the boron-based thin film as the seed layer 4, the reactivity with Cl is suppressed, and as illustrated in FIG. 4B, Cl does not easily terminate the dangling bond. Thus, the number of dangling bond activation sites, which are carbon adsorption sites, is not easily reduced, and reduction of the adhesion of the carbon film due to the inhibition of adsorption is unlikely to be caused. Therefore, a carbon film having good adhesion can be deposited, regardless of a material of the base. Additionally, the seed layer formed of the boron-based thin film suppresses damage caused by Cl. In view of obtaining such an effect, it is preferable that the thickness of the boron-based thin film constituting the seed layer 40 is in the range of 0.5 nm to 3.0 nm.

However, even if such a process of using the boron-based thin film as the base film is performed, it is found that chlorine remains in the carbon layer film, and Cl termination prevents the growth of the carbon film.

Figure 5:
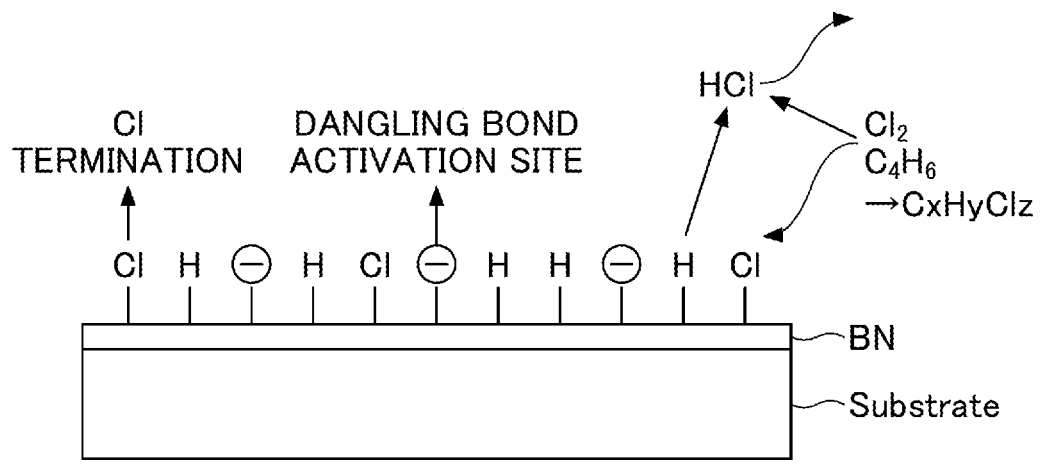
FIG. 5 is a model diagram illustrating a state of a substrate after performing a low temperature CVD process in a case in which the boron-based thin film is used as a base film.

FIG. 5 is a model diagram illustrating a state of the substrate after performing the low temperature CVD process when the boron-based thin film is used as the base film. In a case where the boron thin film is used as the base film, the Cl termination tends to be suppressed in comparison with a case where the silicon film is used as the base film, but it is conceivable that the Cl termination still remains.

Figure 6:
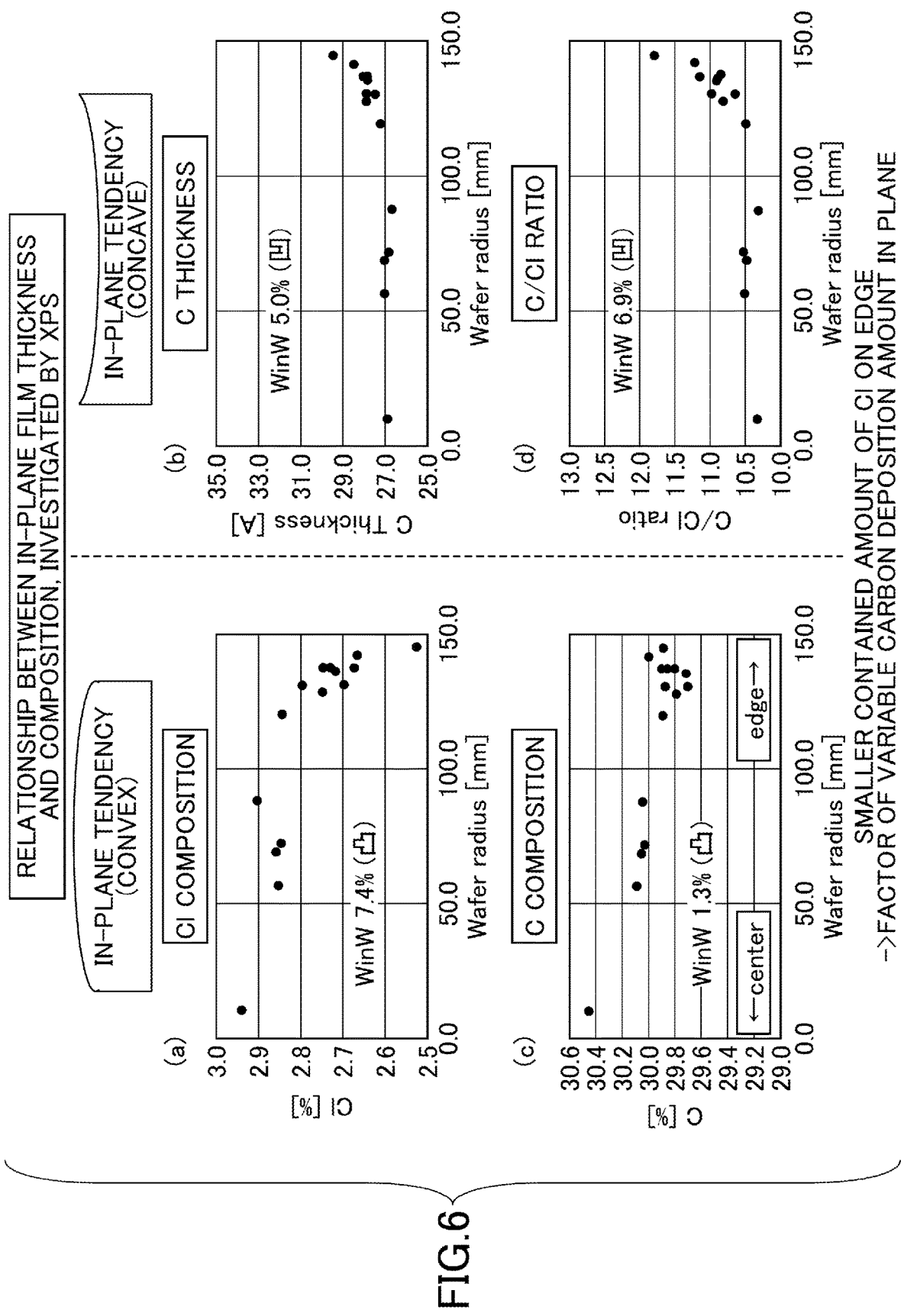
FIG. 6 is a diagram illustrating results of investigating, by using an XPS, a relationship between an in-plane film thickness and a composition in a case in which the boron thin film is used as the base film.

FIG. 6 is a diagram illustrating results of investigating, by using an X-ray photoelectron spectroscopy (XPS), the relationship between the in-plane film thickness and the composition when the boron-based thin film is used as the base film.

Here, (a) in FIG. 6 indicates the Cl composition, (b) in FIG. 6 indicates the carbon film thickness, (c) in FIG. 6 indicates the carbon composition, and (d) in FIG. 6 indicates the C/Cl ratio. In (a) to (d) in FIG. 6, the center of the wafer W is indicated as zero and the edge is indicated as 150 mm.

As illustrated in (a) and (b) in FIG. 6, the carbon film thickness is thicker at the edge than at the center, and the chlorine composition is higher on the center side and lower on the edge side. Additionally, as illustrated in (c) in FIG. 6, the carbon composition is higher on the center side and lower on the edge side. Additionally, as illustrated in (d) in FIG. 6, the C/Cl ratio is higher on the edge side and lower on the center side.

From these results, it can be seen that the carbon film thickness is small in the central portion where the chlorine composition is high, and the carbon film thickness is large in the edge portion where the chlorine composition is low. That is, it is conceivable that the presence of chlorine prevents the growth of the carbon film.

Figure 7:
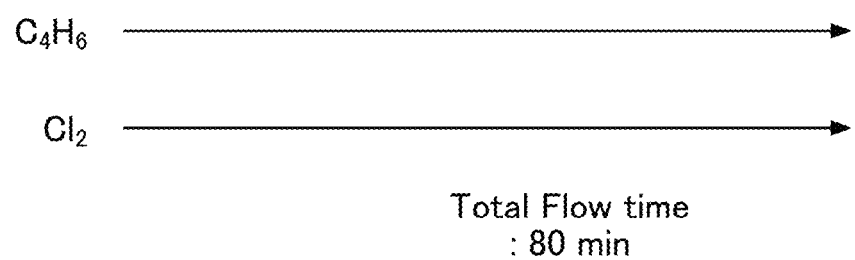
FIG. 7 is a diagram illustrating a sequence of a conventional carbon film deposition method.

FIG. 7 is a diagram illustrating a sequence of a conventional carbon film deposition method. As illustrated in FIG. 7, in the conventional carbon film deposition method, the carbon-containing gas ($C_4H_6$) and the halogen gas ($Cl_2$) are continuously supplied.

Figure 8:
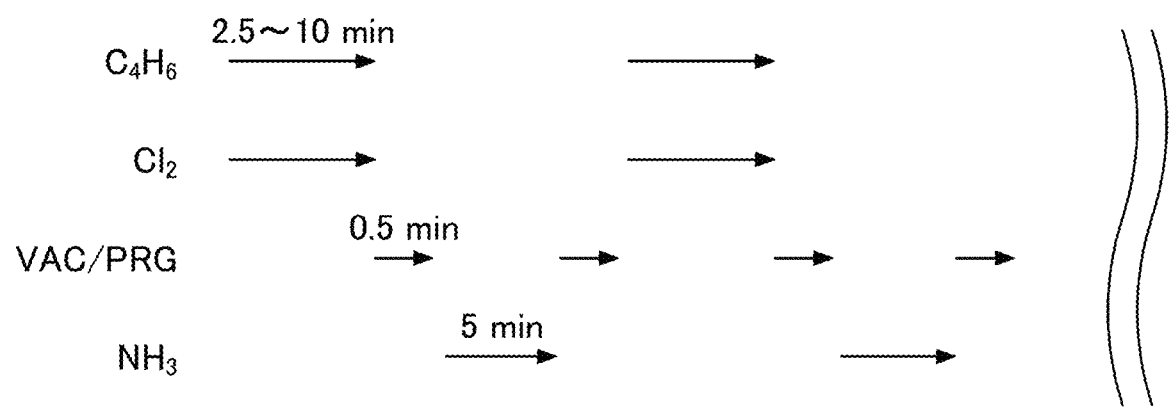
FIG. 8 is a diagram illustrating an example of a sequence of the carbon film deposition method according to the embodiment of the present disclosure.

FIG. 8 is a diagram illustrating an example of a sequence of the carbon film deposition method according to the embodiment of the present disclosure. As illustrated in FIG. 8, in the deposition process according to the embodiment of the present disclosure, after supplying the carbon-containing gas and the halogen gas, the supply is stopped and a gas that reacts with the halogen to vaporize is supplied. In FIG. 8, $C_4H_6$ is supplied as the carbon-containing gas and $Cl_2$ is supplied as the halogen gas. Ammonia ($NH_3$) is supplied as the gas that reacts with the halogen gas. Here, the time indicated in FIG. 8 is merely an example and it is not intended to limit the embodiment thereto. It is intended to illustrate an example of the time ratio.

Ammonia reacts with the Cl termination to form $NH_4Cl$, and the Cl termination can be removed. Thus, ammonia is supplied as a reaction gas for Cl removal. Here, ammonia can react with F, Br, or I, which are halogens other than Cl, and can be used as the halogen reaction gas even when a halogen gas other than chlorine is used.

In addition, $H_2$ or $N_2$ can be used as a gas that reacts with halogen. However, in a low temperature CVD process at a temperature less than 400° C., ammonia is most reactive with halogen and can effectively remove halogen.

Here, before and after the supply of ammonia, the exhaust/purge process may be performed. This is a process provided to remove $C_4H_6$ and $Cl_2$ or $NH_3$ present in the processing chamber S, which are not necessarily required, and the exhaust/purge process may be provided if necessary.

The exhaust process is a process of increasing the exhaust amount by increasing the opening degree of the exhaust valve, and the purge process is a process of supplying the inert gas to the wafer W. Either the exhaust process or the purge process may be performed, or both may be performed.

As the inert gas, a gas, such as $N_2$, Ar, He, or the like may be used. For example, $N_2$ may be used as the inert gas.

The exhaust/purge process is intended to smoothly switch gases in the processing chamber S, and, for example, ammonia can be provided immediately after the low temperature CVD process, or the carbon-containing gas and the halogen gas can be provided immediately after the ammonia is supplied.

Here, the ammonia may be supplied multiple times in a short period of time, which will be described later.

After the deposition of the carbon film is completed, the inside of the processing chamber S is exhausted by the exhaust device 107, and the inside of the processing chamber S is purged by the inert gas source 131d supplying, for example, the $N_2$ gas to the processing chamber S as the purge gas. Then, after the inside of the processing chamber S is returned to the atmospheric pressure, the wafers W are transferred outside of the processing chamber S by lowering the wafer boat 112.

Figure 9A:
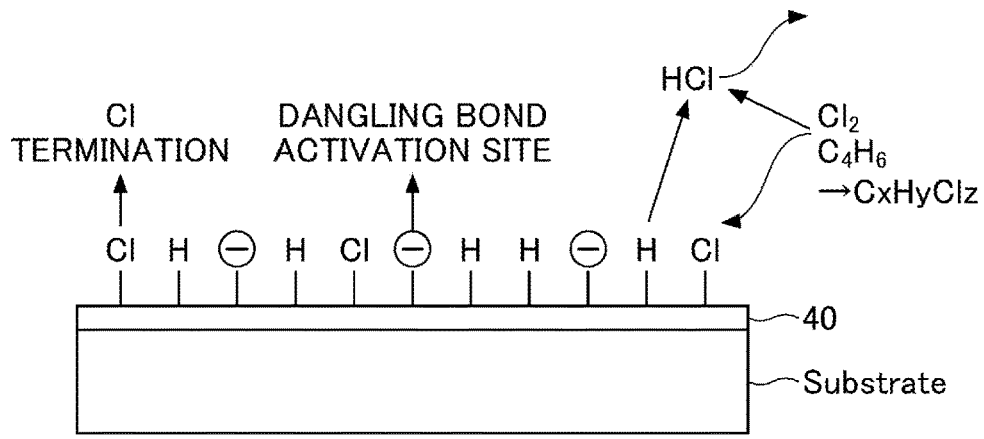
FIG. 9A, FIG. 9B, and FIG. 9C are diagrams for explaining a mechanism of a halogen reaction gas supply process.
Figure 9B:
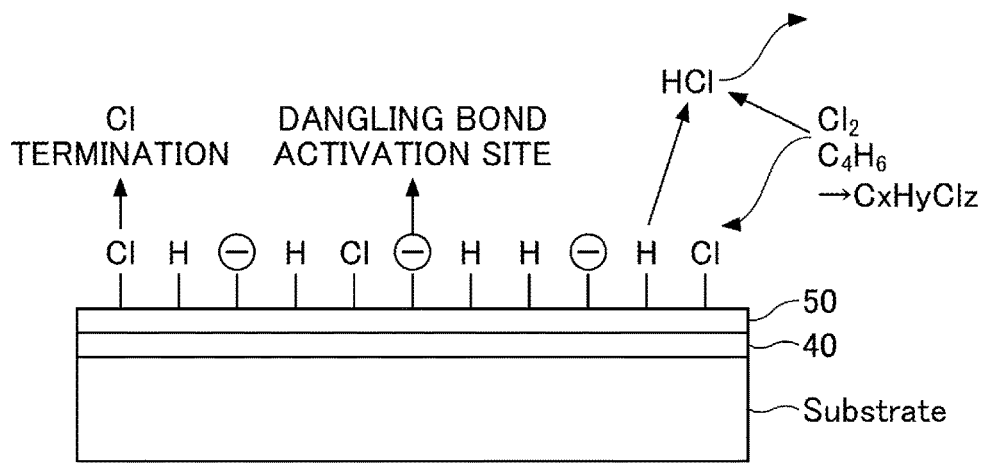
Figure 9C:
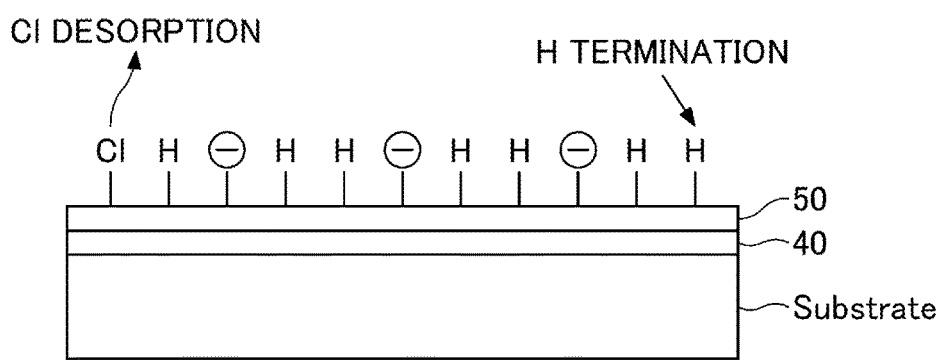

FIG. 9A, FIG. 9B, and FIG. 9C are diagrams for explaining a mechanism of a halogen reaction gas supply process. FIG. 9A is a diagram illustrating a state in which a hydrogen termination and a chlorine termination are disposed on the seed layer in addition to the dangling bond activation sites, which are carbon-containing gas adsorption sites, on the surface of the seed layer 40. That is, FIG. 9A is a diagram illustrating a substrate state before a carbon film is deposited.

FIG. 9B is a diagram illustrating a surface state of the substrate in the carbon film deposition process. As illustrated in FIG. 9B, in the low temperature CVD process, because chlorine is supplied as the catalyst in addition to the carbon-containing gas $C_4H_6$, chlorine remains in the carbon film. Thus, on the surface of the carbon film 50, hydrogen and chlorine terminations are present, in addition to the dangling bond activation sites. The residual chlorine inhibits the growth of the carbon film 50, as described with reference to FIG. 6.

FIG. 9C is a diagram illustrating an example of the halogen reaction gas supply process. In the halogen reaction gas supply process, a gas that can react with the halogen to vaporize is supplied to the wafer W. The gas that can react with the halogen to vaporize is, for example, ammonia gas, the ammonia gas reacts with the chlorine termination to form $NH_4Cl$ to vaporize, and the chlorine in the carbon film 50 is removed. As described, the removal of the Cl termination increases the H terminations. This can contribute to improving the quality and productivity of the carbon film 50. Here, the reaction formula in which chlorine is removed is expressed as (1). This can form the carbon-containing gas adsorption sites while removing chlorine and hydrogen from the chlorine and hydrogen terminations.

$$Cl+H+NH_3 \rightarrow NH_4Cl \qquad (1)$$

As described above, according to the carbon film deposition method of the present embodiment, the chlorine density inside the carbon film 50 can be reduced, and the deposition rate and deposition quality of the carbon film 50 can be improved.

EXAMPLES

The carbon film deposition method according to the present embodiment illustrated in FIG. 8 was performed by setting the time durations and the number of repetitions of the carbon film deposition process and the chlorine reaction gas supply process. In the following, examples will be described.

Figures 10, 11:
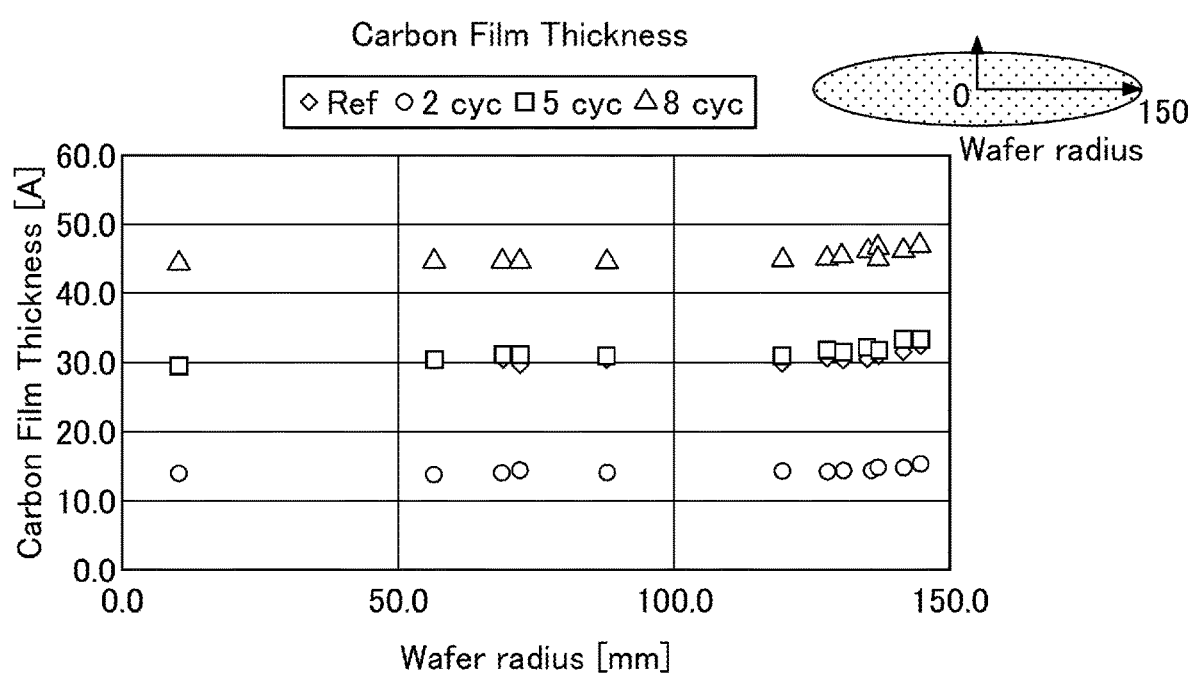
FIG. 10 is a table indicating examples in which the carbon film deposition method according to the present embodiment is performed.
FIG. 11 is a graph indicating results of performing Comparative Example and Examples 1 to 3.

FIG. 10 is a table indicating the examples in which the carbon film deposition method according to the present embodiment is performed. $C_4H_6$ and $Cl_2$ were used to deposit the carbon film in the carbon film deposition process, and $NH_3$ was used for the chlorine reaction gas in the halogen reaction gas supply process.

As illustrated in FIG. 10, a process, in which $C_4H_6$ and $Cl_2$ are supplied for 80 minutes to deposit the carbon film and ammonia is not supplied, is used as Comparative Example.

In Example 1, the carbon film deposition process and the halogen reaction gas supply process were performed by two cycles with the carbon film deposition time of 10 minutes and the ammonia supply time of 5 minutes. The total process time is 30 minutes and the total time of the carbon film deposition process is 20 minutes.

In Example 2, the carbon film deposition process and the halogen reaction gas supply process were performed by five cycles with the carbon film deposition time of 10 minutes and the ammonia supply time of 5 minutes. The total process time is 75 minutes and the total time of the carbon film deposition process is 50 minutes.

In Example 3, the carbon film deposition process and the halogen reaction gas supply process were performed by 8 cycles with the carbon film deposition time of 10 minutes and the ammonia supply time of 5 minutes. The total process time is 120 minutes and the total time of the carbon film deposition process is 80 minutes.

In Example 4, the carbon film deposition process and the halogen reaction gas supply process were performed by 10 cycles with the carbon film deposition time of 5 minutes and the ammonia supply time of 5 minutes. The total process time is 100 minutes and the total time of the carbon film deposition process is 50 minutes.

In Example 5, the carbon film deposition process and the halogen reaction gas supply process were performed by 20 cycles with the carbon film deposition time of 2.5 minutes and the ammonia supply time of 5 minutes. The total process time is 150 minutes and the total time of the carbon film deposition process is 50 minutes.

FIG. 11 is a graph indicating results of Comparative Example and Examples 1 to 3. In FIG. 11, Ref indicates the result of Comparative Example, 2 cyc indicates the result of Example 1, 5 cyc indicates the result of Example 2, and 8 cyc indicates the result of Example 3. The horizontal axis indicates a position [mm] in the radial direction when the center of the wafer W is zero, and the vertical axis indicates the film thickness [Å].

As indicated in FIG. 11, the carbon film thickness of Example 3 is the largest, and the carbon film thickness of Comparative Example and Example 2 is substantially the same. While, in Comparative Example, the carbon film deposition process is a process for 80 minutes, in Example 2, the carbon film deposition process is a process for 50 minutes. Thus, it can be seen that the time of the carbon film deposition is reduced to ⅝, and the deposition rate is 1.6 (=8/5) times.

Therefore, it can be seen that in Example 1 in which the time of the carbon film deposition process is only 20 minutes, the film thickness is smaller than the film thickness in Comparative Example, but in Example 2 in which the time of the carbon film deposition process is only 50 minutes, the film thickness is substantially the same as the film thickness in Comparative Example, and in Example 3 in which the time of the carbon film deposition process is 80 minutes as in Comparative Example, the deposition rate significantly exceeds the deposition rate in Comparative Example.

Thus, according to FIG. 11, it is indicated that the deposition rate of the carbon film can be significantly increased by increasing the number of cycles in which the carbon film deposition process and the halogen reaction gas supply process are repeated.

Figure 12A:
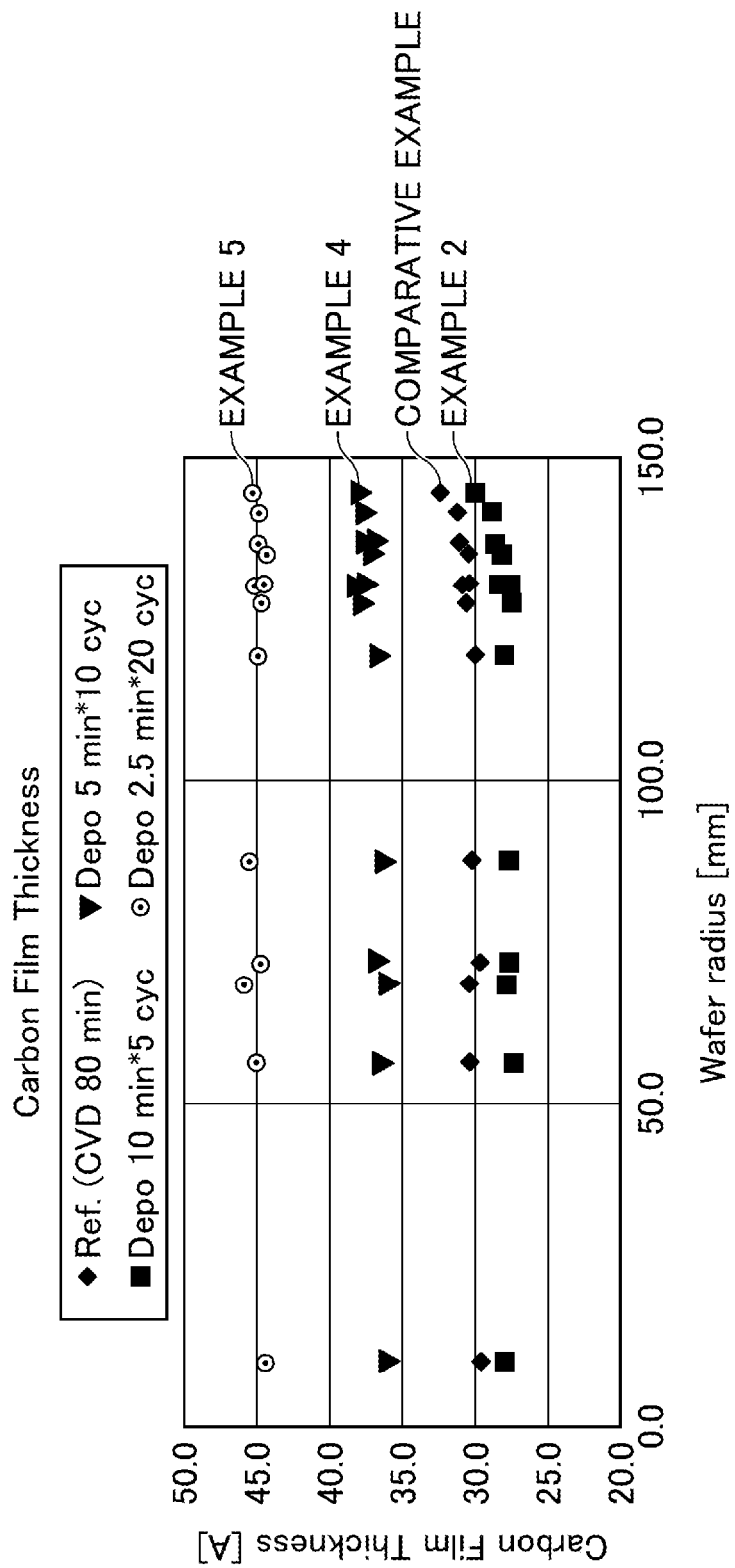
FIG. 12A and FIG. 12B are graphs indicating results of performing Comparative Example, Example 2, Example 4, and Example 5.
Figure 12B:
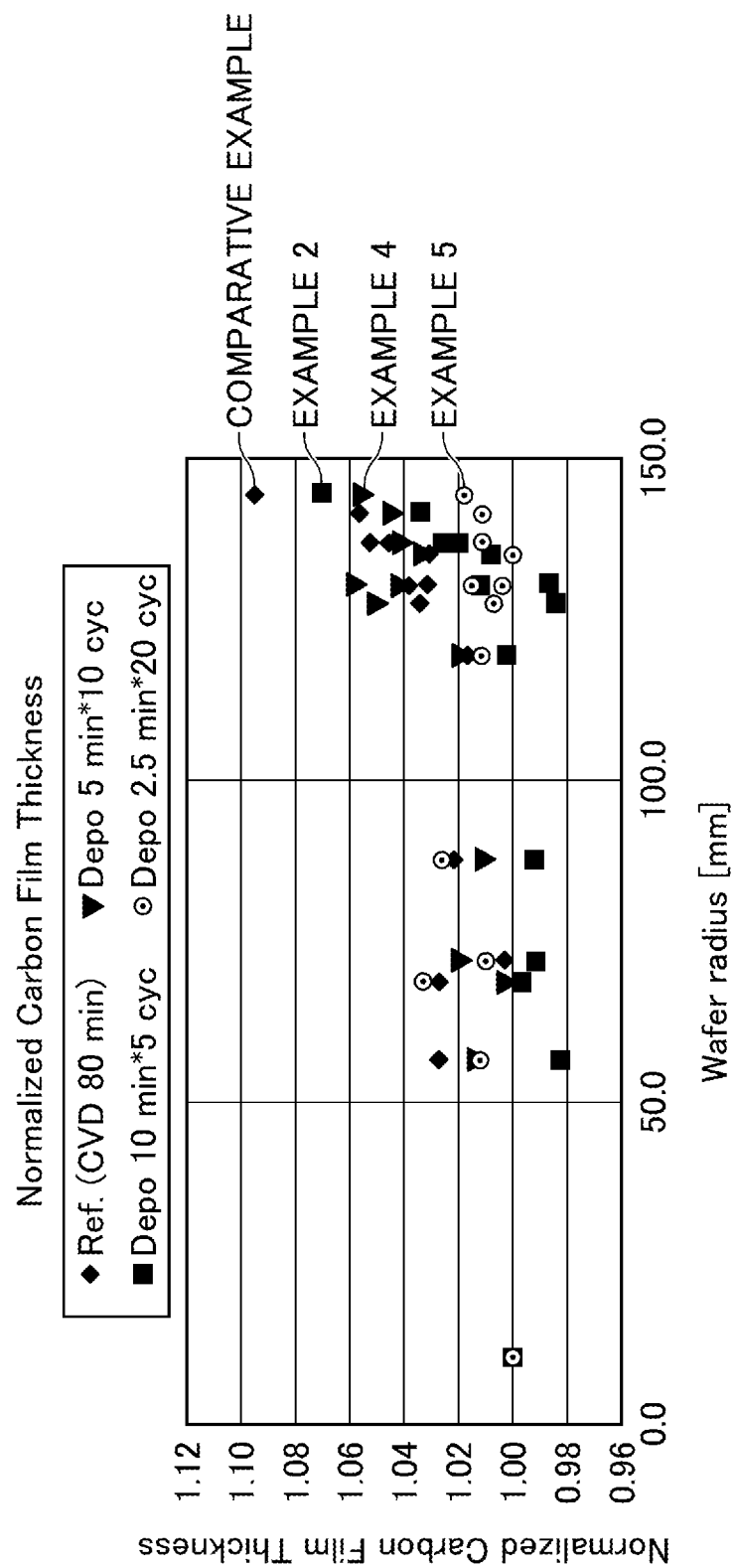

FIG. 12A and FIG. 12B are graphs indicating results of performing Comparative Example, Example 2, Example 4, and Example 5. In FIG. 12A, the horizontal axis indicates a position in the radial coordinates of the wafer W, the vertical axis indicates the film thickness of the carbon film, and the film thickness of the carbon film on the position of the radial coordinates of the wafer W is indicated. The time of performing the carbon film deposition process per one time in Example 2 is 10 minutes, the time of performing the carbon film deposition process per one time in Example 4 is 5 minutes, and the time of performing the carbon film deposition process per one time in Example 5 is 2.5 minutes. Because the total time of the carbon film deposition process is 50 minutes in all examples, the effect of the time of performing the carbon film deposition per one time can be examined.

As indicated in FIG. 12A, the film thickness of Example 5, in which the film deposition time per one time is the shortest, is the largest, the film thickness of Example 4, in which the film deposition time per one time is second shortest, is second largest, followed by the film thickness of Comparative Example, and the film thickness of Example 2, in which the film deposition time per one time is the longest, is the smallest.

Here, the deposition time of Comparative Example is 80 minutes and the deposition time of Examples 2, 4, and 5 is 50 minutes. Thus, even if the film thickness of Example 2 is smaller than the film thickness of Comparative Example, the deposition rate of Example 2 is not lower than the deposition rate of Comparative Example.

Comparing Examples 2, 4, and 5, it is indicated that when the total deposition time is the same, it is more effective to shorten the deposition time per one time and increase the number of cycles. Thus, according to FIG. 12A, it is indicated that the process, in which the time of the carbon film deposition process and the halogen reaction gas supply process per one time is shortened and the number of times is increased, is more effective than the process, in which the number of times is reduced and the time of the process per one time is increased.

FIG. 12B is a graph obtained by normalizing the results of FIG. 12A by setting a central film thickness to 1 in each example. This indicates the uniformity of the film thickness.

As indicated in FIG. 12B, the film thickness of Example 5 is the most uniform from the center to the outer periphery of the wafer W. In Example 4, the variation in the outer periphery is larger than that of Example 5, but smaller than that of Example 2. Additionally, the variation of Example 2 is smaller than that of Comparative Example.

Thus, according to FIG. 12B, it is indicated that a deposition pattern, in which the deposition time per one time is short and the number of cycles is great, is excellent not only in the deposition rate but also in the uniformity of the film thickness.

Figure 13A:
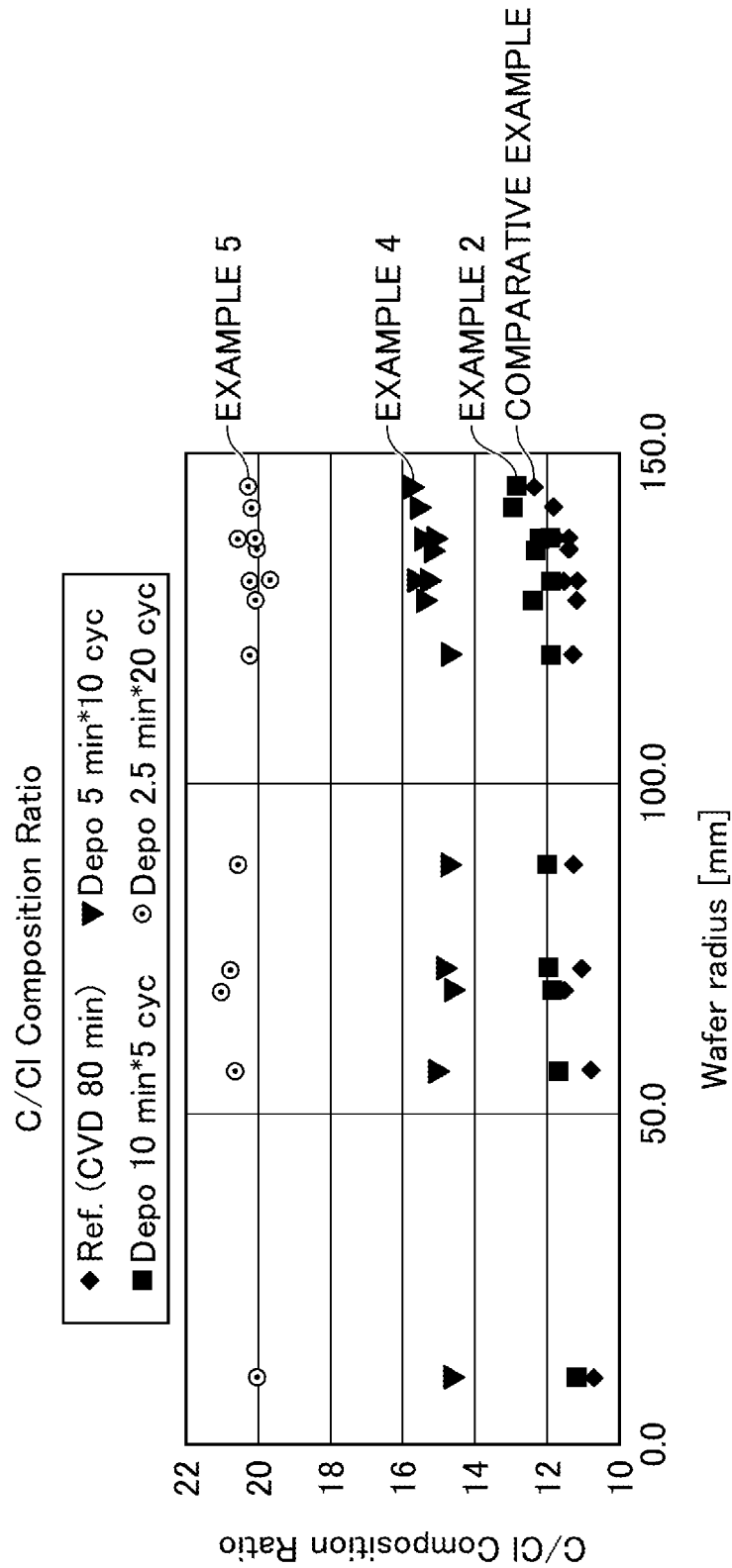
FIG. 13A and FIG. 13B are graphs indicating results of performing Comparative Example, Example 2, Example 4, and Example 5 by a C/Cl composition ratio.
Figure 13B:
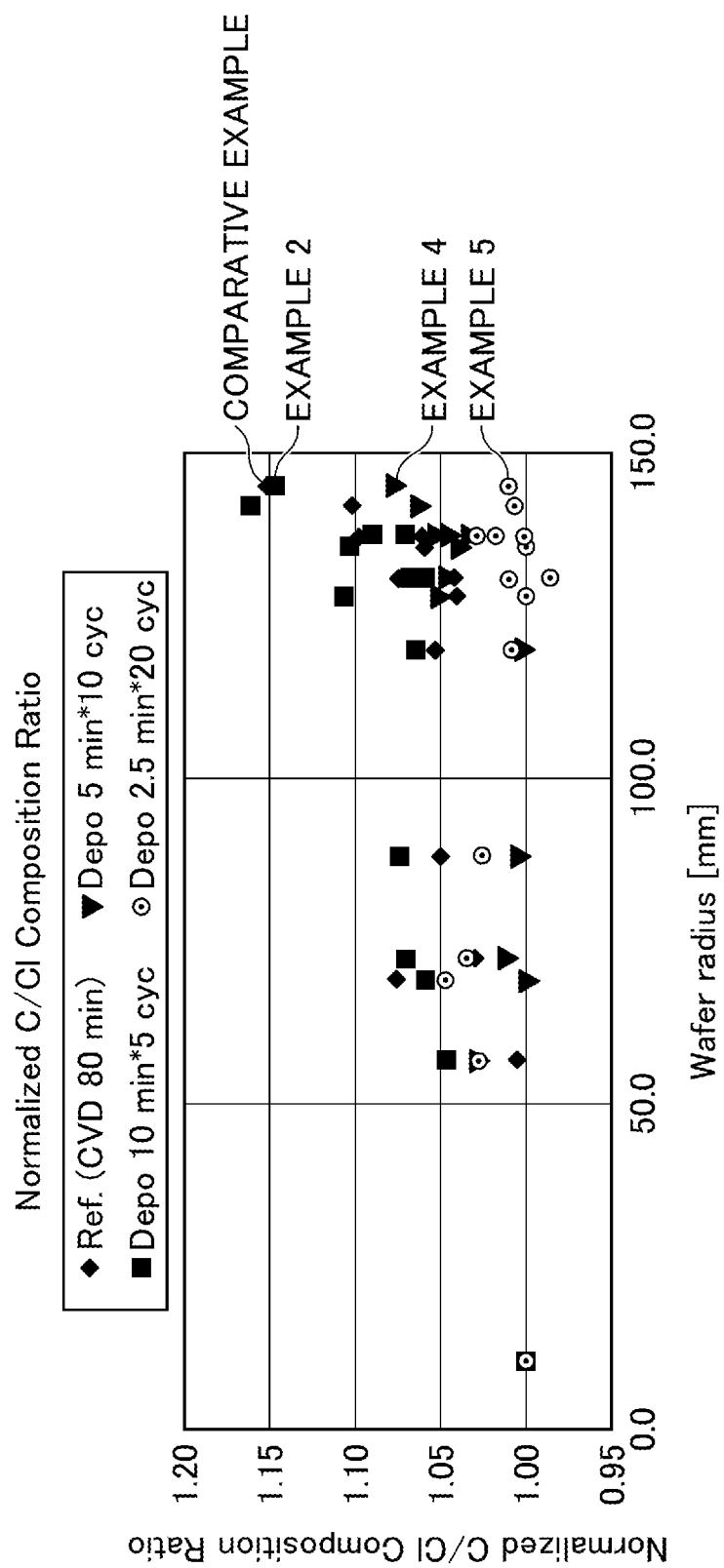

FIG. 13A and FIG. 13B are graphs indicating results of performing Comparative Example, and Examples 2, 4, and 5, by the C/Cl composition ratio. FIG. 13A is a graph indicating the C/Cl composition ratios of Comparative Example, Example 2, Example 4, and Example 5 with the horizontal axis representing a position in the radial coordinates of the wafer W.

FIG. 13A indicates substantially the same tendency as FIG. 12A, and the C/Cl composition ratio is increased in the order of Example 5, Example 4, Example 2, and Comparative Example. However, it can be seen that the differences between the C/Cl composition ratios of Examples 5 and 4 and the C/Cl composition ratio of Example 2 are significantly large. That is, it can be seen that when a film deposition process having a large number of cycles is performed, the carbon density increases, and the Cl density decreases, thereby increasing the purity of the carbon film.

FIG. 13B is a graph indicating the C/Cl composition ratio obtained by normalizing the results by setting the C/Cl composition ratio of the center of the wafer W to 1.

FIG. 13B also indicates that, similarly with FIG. 12B, the C/Cl composition ratio of an example having a larger number of cycles is more uniform than that of an example having a smaller number of cycles. As described, it can be seen that supplying $NH_3$ repeatedly in a small amount eliminates in-plane variation caused by carbon adsorption inhibition of the Cl termination, and improves the uniformity of the carbon film.

FIG. 14 is a table indicating the results of the examples as a whole. In FIG. 14, the contents of the carbon deposition process and the results of the film deposition rate and the in-plane uniformity are indicated with respect to Comparative Example, Example 2, Example 4, and Example 5.

As described with reference to FIG. 12A, FIG. 12B, FIG. 13A, and FIG. 13B, the time of the carbon film deposition process of Comparative Example is 80 minutes and the time of the carbon film deposition process of Examples 2, 4 and 5 is 50 minutes. Additionally, the $NH_3$ annealing time in the halogen reaction gas supply process is set to 5 minutes, and the number of cycles is set to 5, 10, and 20 cycles with respect to Examples 2, 4 and 5, respectively.

Under such conditions, the deposition rate of Comparative Example is 0.38 nm/min, the deposition rate of Example 2 is 0.56 nm/min, the deposition rate of Example 4 is 0.74 nm/min, and the deposition rate of Example 5 is 0.90 nm/min. The deposition rate increases as the number of cycles increases. With respect to the in-plane uniformity, the in-plane uniformity of Comparative Example is 4.6, the in-plane uniformity of Example 2 is 4.3, the in-plane uniformity of Example 4 is 2.8, and the in-plane uniformity of Example 5 is 1.6. The in-plane uniformity is also improved as the number of cycles increases.

As described above, the carbon film deposition process is performed by using the carbon-containing gas and the halogen gas, followed by performing a process to remove halogen by using a gas that reacts with halogen to vaporize, such as ammonia. The cycle of the carbon film deposition process and the halogen removing process is shortened and performed a large number of times, thereby improving the film deposition rate and uniformity.

Here, it may be suitably determined whether the exhaust/purge process in FIG. 8 is used, and any gas may be used as the carbon-containing gas, but the hydrocarbon-based gas may be preferably used. As the halogen gas, in addition to chlorine, fluorine, iodine, bromine, or the like may be used. Further, as the halogen reaction gas that reacts with the halogen gas, in addition to ammonia, hydrogen and nitrogen may be used. However, it is preferable to use ammonia from a point of view of reactivity in the process of the low temperature CVD in which the temperature is less than or equal to 400° C. Hydrogen and nitrogen may be used as the halogen reaction gas in the high temperature CVD process in which the temperature is from 500° C. to 800° C.

According to the present disclosure, the deposition rate and uniformity of the carbon film can be improved.

While the preferred embodiments and examples of the present disclosure have been described in detail above, the present disclosure is not limited to the embodiments and examples described above, and various modifications and substitutions may be made to the embodiments and examples described above without departing from the scope of the present disclosure.

What is claimed is:

1. A carbon film deposition method comprising:
supplying a carbon-containing gas and a halogen gas to a substrate to deposit a carbon film on the substrate by using chemical vapor deposition; and
supplying a gas that reacts with halogens constituting the halogen gas to reduce the halogens contained in the carbon film;
wherein a cycle is repeated a plurality of times, the cycle including the supplying of the carbon-containing gas and the halogen gas and the supplying of the gas that reacts with the halogens.

2. The carbon film deposition method as claimed in claim 1, wherein the gas that reacts with the halogens is ammonia gas.

3. The carbon film deposition method as claimed in claim 1, wherein a number of the plurality of times is greater than or equal to 5.

4. The carbon film deposition method as claimed in claim 1, wherein the supplying of the carbon-containing gas and the halogen gas and the supplying of the gas that reacts with the halogens are performed under a temperature less than or equal to 400° C.

5. The carbon film deposition method as claimed in claim 1, wherein the halogen gas is a chlorine gas, a fluorine gas, a bromine gas, or an iodine gas.

6. The carbon film deposition method as claimed in claim 1,
wherein the carbon-containing gas is a hydrocarbon-based gas.

7. The carbon film deposition method as claimed in claim 6, wherein the hydrocarbon-based gas is a $C_4H_6$ gas.

8. The carbon film deposition method as claimed in claim 1, further comprising supplying a purge gas to the substrate after the supplying of the carbon-containing gas and the halogen gas and before the supplying of the gas that reacts with the halogens, and after the supplying of the gas that reacts with the halogens and before the supplying of the carbon-containing gas and the halogen gas.

9. The carbon film deposition method as claimed in claim 8, wherein the purge gas is an inert gas.

10. The carbon film deposition method as claimed in claim 9, wherein the inert gas is nitrogen gas.

11. The carbon film deposition method as claimed in claim 8, wherein the supplying of the purge gas includes supplying the purge gas while an inside of a processing chamber where the substrate is provided is vacuumed.

12. A carbon film deposition apparatus comprising:
a processing chamber;
a substrate holding member provided in the processing chamber;
a process gas supply configured to supply a carbon-containing gas and a halogen gas to the substrate holding member; and
a halogen reaction gas supply configured to supply a gas that reacts with halogens constituting the halogen gas.

* * * * *